United States Patent [19]

Malhi

[11] Patent Number: 5,486,484
[45] Date of Patent: Jan. 23, 1996

[54] LATERAL POWER MOSFET STRUCTURE USING SILICON CARBIDE

[75] Inventor: Satwinder Malhi, Garland, Tex.

[73] Assignee: Texas Instruments Incorporated, Dallas, Tex.

[21] Appl. No.: 255,023

[22] Filed: Jul. 25, 1994

Related U.S. Application Data

[62] Division of Ser. No. 20,475, Feb. 22, 1993.

[51] Int. Cl.⁶ ................................................. H01L 21/443
[52] U.S. Cl. .............................. 437/41; 437/100; 437/979
[58] Field of Search ........................ 257/76, 77; 437/100, 437/41, 43, 979

[56] References Cited

U.S. PATENT DOCUMENTS

| | | |
|---|---|---|
| 3,339,128 | 8/1967 | Olmstead et al. |
| 4,994,413 | 2/1991 | Eshita ........................................ 257/77 |
| 5,057,451 | 10/1991 | McCollum ............................... 437/979 |
| 5,215,934 | 6/1993 | Tzeng ........................................ 437/43 |
| 5,314,834 | 5/1994 | Mazure et al. ............................ 437/43 |

FOREIGN PATENT DOCUMENTS

| | | | |
|---|---|---|---|
| 60-57968A | 4/1985 | Japan ..................................... 437/979 |
| WO89/04056 | 5/1989 | WIPO ..................................... 257/77 |

*Primary Examiner*—Olik Chaudhuri
*Assistant Examiner*—Brian K. Dutton
*Attorney, Agent, or Firm*—Jacqueline J. Garner; Richard L. Donaldson; William E. Hiller

[57] ABSTRACT

A MOSFET device (100) having a silicon carbide substrate (102). A channel region (106) of a first conductivity type and an epitaxial layer (104) of a second conductivity type are located above the silicon carbide substrate (102). First and second source/drain regions (118), also of the first conductivity type are located directly within the channel region (106). No well region is placed between the first and second source/drain regions (118) and the channel region (106). A gate (120) is separated from the channel region (106) by an insulator layer (110). Insulator layer (110) has a thin portion (114) and a thick portion (116).

4 Claims, 5 Drawing Sheets

LATERAL POWER MOSFET STRUCTURE USING SILICON CARBIDE

This is a division of application Ser. No. 08/020,475, filed Feb. 22, 1993.

FIELD OF THE INVENTION

This invention generally relates to semiconductor devices and processes and more specifically to power MOSFETs.

BACKGROUND OF THE INVENTION

A growing segment of the semiconductor business is high voltage/high power devices and integrated circuits. A critical element in this business is the power MOSFET. Power MOSFETs have many diverse applications in automotive, communications, consumer, data processing, industrial and military markets. For example, power MOSFETs may be used as drivers for motors, lamps, or displays. Most power MOSFETs are built in silicon. However, the performance of power MOSFETs built in silicon are already close to their theoretical limits. Therefore, research efforts have turned to silicon carbide (SIC) wafers. SiC has the potential for significantly (as much as two orders of magnitude) higher performance power MOSFETs compared to silicon wafers. However, one of the limitations in using SiC is that the wafer size is much smaller than traditional silicon wafers. SiC wafers have been limited to approximately I inch diameters. This inhibits their use or production in existing silicon wafer fabrication facilities built to handle large wafers.

A typical prior art MOSFET built using silicon carbide (SIC) is shown in FIG. 1. The device 10 has a p-type epitaxial layer 14 adjacent a p-type SiC substrate 12. The MOSFET channel 16 was built in a 1.2 μm thick n-type β-SiC epitaxial layer. A polysilicon annular gate electrode 18 was used. Source/drain regions 20 were implanted at 773 K and contacted with Tantalum Silicide (TaSi2) 22 which was annealed at 1173 K. The depletion threshold voltage was −12.9 V and the device 10 operated up to a drain voltage of 25 V at temperatures up to 923 K.

SUMMARY OF THE INVENTION

Generally, and in one form, a MOSFET device having a silicon carbide substrate is disclosed. A channel region of a first conductivity type is located above said silicon carbide substrate. First and second source/drain regions, also of the first conductivity type are located directly within the channel region. No well region is placed between the first and second source drain regions and the channel region.

An advantage of the invention is providing an improved high voltage device.

A further advantage of the invention is providing an improved high voltage silicon carbide device that does not require a high temperature anneal.

A further advantage of the invention is providing an improved silicon carbide MOSFET that is capable of handling higher voltages.

Other advantages will be apparent to those having ordinary skill in the art having reference to the following specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 2:
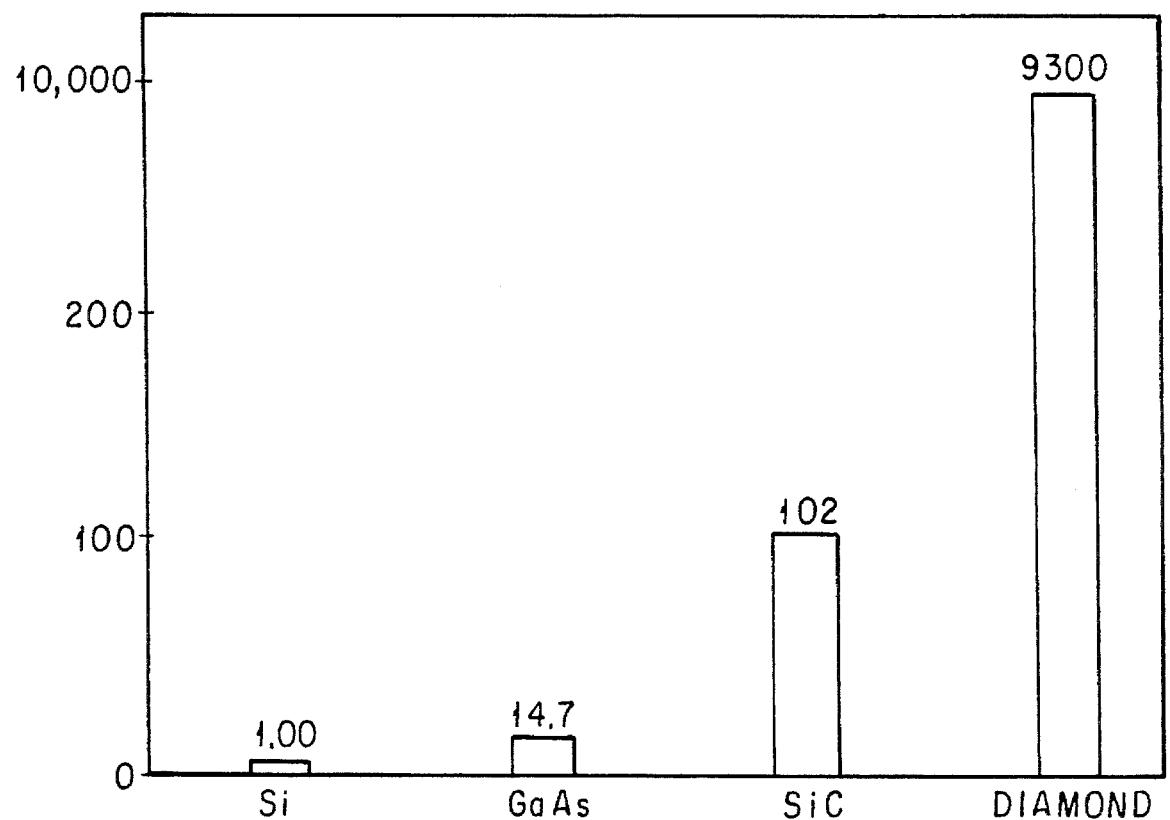
FIG. 2 is a plot of 1/Rsp characteristics for various materials.

The power MOSFET is a switch, much like an electromechanical relay is a switch, but it is much smaller, more reliable, and can be electronically controlled. The key performance figure for the power MOSFET is specific on-resistance (Rsp), or the resistance of tiffs switch per unit die area when the device is switched on. A goal in power MOSFET technology- is reducing the specific on-resistance as much as possible. This leads to 1/Rsp as a convenient figure of merit which should be maximized. The Rsp, depends on the semiconductor material properties, and the figure of merit can be written as $$\text{FIGURE OF MERIT} = 1/Rsp = \epsilon * \mu * Ec^3$$

where $\epsilon$ is the dielectric constant, $\mu$ is the carrier mobility, Ec is the avalanche electric field, and V is the breakdown voltage rating of the device. Table 1 lists the properties of a few candidate materials and FIG. 2 plots the 1/Rsp figure of merit.

| Parameter | Symbol | Units | Si | SiC |
|---|---|---|---|---|
| Relative Dielectric Constant | $\epsilon$ | C/V.cm | 11.8 | 9.7 |
| Mobility | $\mu$ | cm$^2$/V.sec | 1400 | 300 |
| Critical Field | $E_c$ | V/cm | $3 \times 10^5$ | $2.5 \times 10^6$ |
| Figure of Merit Factor | $\epsilon*\mu*Ec^3$ | — | $4.46 \times 10^{20}$ | $4.55 \times 10^2$ |
| Relative Figure of Merit | — | — | 1 | 102 |

SiC has the potential of 100X higher performance compared to Si power MOSFETs. It can be oxidized to form high quality silicon dioxide (SiO2) to serve as gate insulator. SiC wafers are commercially available. This material can be processed in the same wafer fabrication facilities that produce silicon devices without any cross-contamination problem. This is very important since new dedicated wafer fabrication facilities require huge capital investment.

Figure 1:
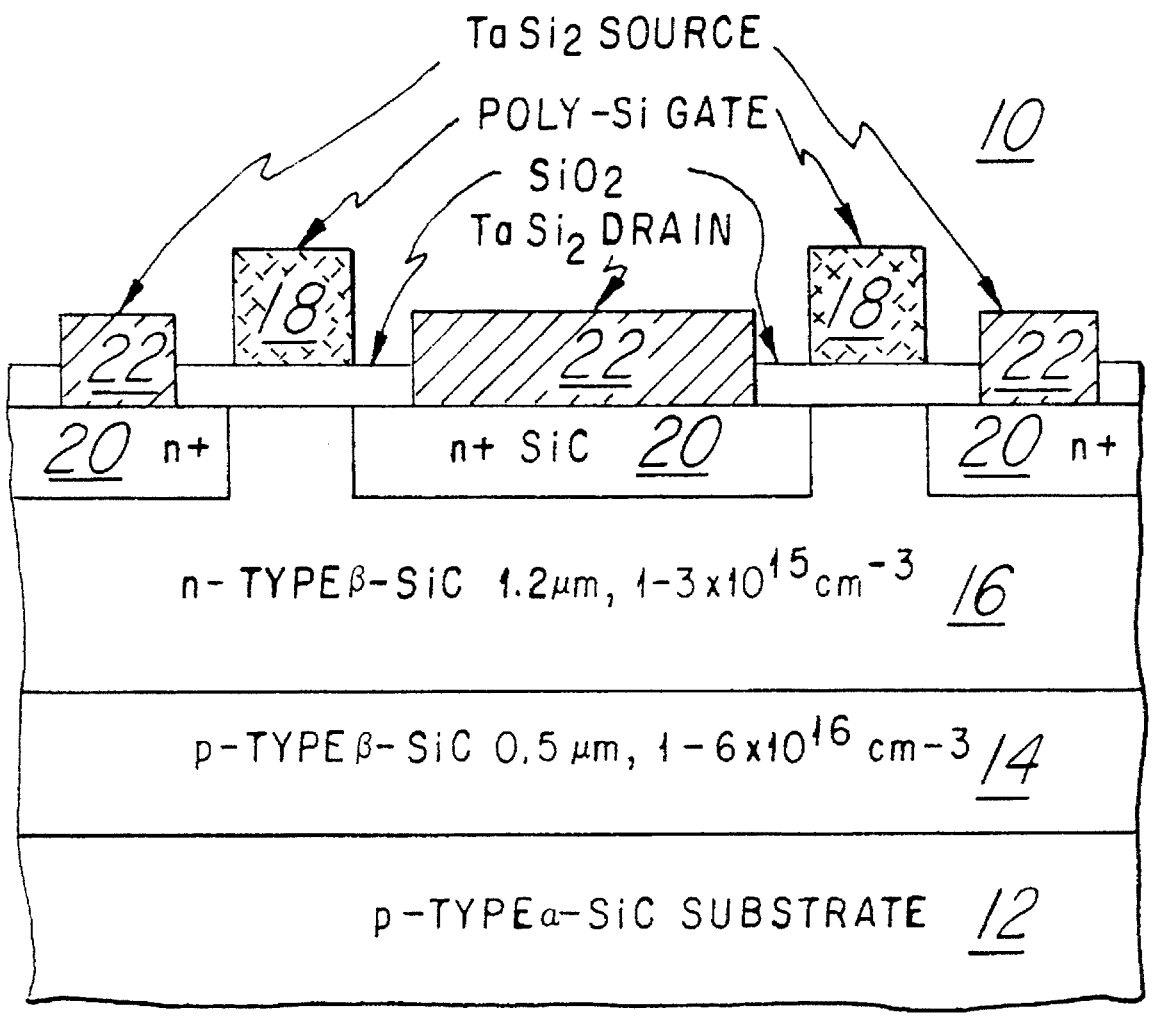
FIG. 1 is a cross-sectional view of a prior art MOSFET built in SiC.

Prior art SiC MOSFETs, such as that shown in FIG. 1, require a high temperature implant and anneal to form source/drain regions 20. Diffusion of dopants in SiC is extremely slow. Accordingly, anneals at temperatures on the order of 1800°–1900° C. are required. This temperature requirement exceeds the capability of most existing wafer fabrication equipment. One method of reducing tile temperature required for an anneal is to increase the temperature at which the implant is performed. Unfortunately, implant temperatures on the order of 500°–700° C. are then required. These temperature requirements also exceeds the capability of most existing wafer fabrication equipment. Accordingly, a device is needed which eliminates the high temperature requirements of prior art devices.

Figure 3:
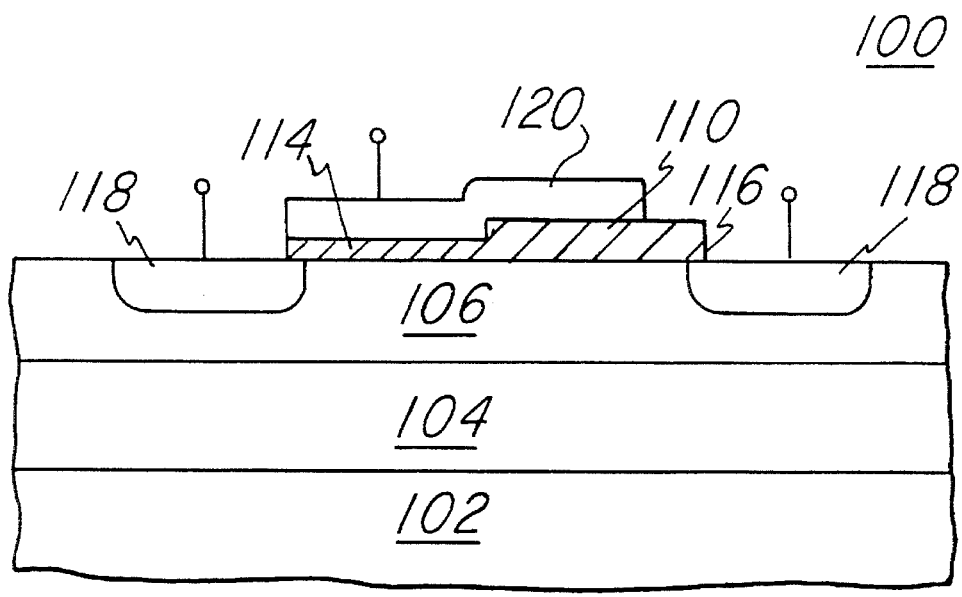
FIG. 3 is a cross-sectional view of the preferred embodiment of the invention.

The preferred embodiment of the invention will now be described with reference to a n-channel power MOSFET. It will be apparent to those skilled in the art that the invention may also be used for p-channel MOSFETs. Referring to FIG. 3, MOSFET 100 contains a substrate 102 which may, for example, comprise n-type 6H-t-SiC. P-type epitaxial layer 104 is located adjacent substrate 102. Of course, a p-type substrate may alternatively be used, in which case p-type epitaxial layer 104 would be omitted. Channel 106 is a n-type epitaxial layer located adjacent p-type epitaxial layer 104. Source/drain regions 118 are located in the surface of channel region 106. Gate 120 is separated from channel region 106 by insulator layer 110. Gate 120 may, for example, comprise polysilicon and insulator layer 110 may, for example comprise silicon dioxide (SiO2). Of course, other conductive materials may alternatively be used for gate 120 such as monocrystalline, microcrystalline, and polycrystalline silicon carbide. Insulator layer 110 has a thin portion 114 and a thick portion 116. Thin portion 114 provides an advantage of higher performance and thick portion 116 provides the capability to handle higher voltages, such as voltages in the range of 50–500 V.

Figure 4A:
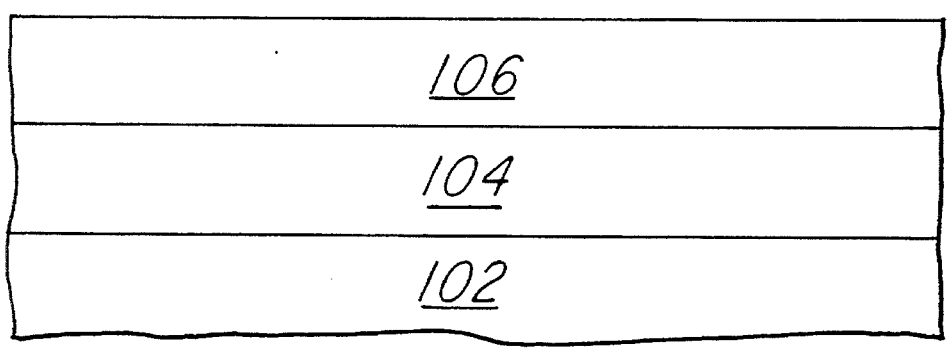
FIGS. 4a–f are cross-sectional views illustrating various states of fabrication of the preferred embodiment of the invention.

The preferred method for forming MOSFET 100 will now be described with reference to FIGS. 4a–f. Referring to FIG. 4a, p-type epitaxial layer 104 is formed on substrate 102 by, for example, chemical vapor deposition (CVD). Other methods, such a molecular beam epitaxy (MBE), will be apparent to those skilled in the art. Then, n-type epitaxial layer 106 is formed on p-type epitaxial layer 104. CVD may also be used to form n-type epitaxial layer 106.

Figure 4B:
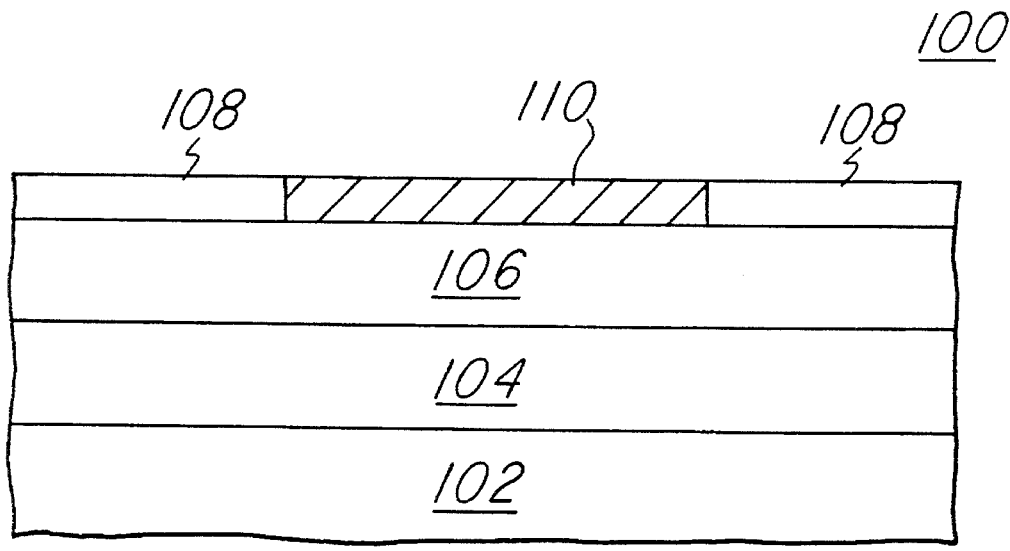
Figure 4C:
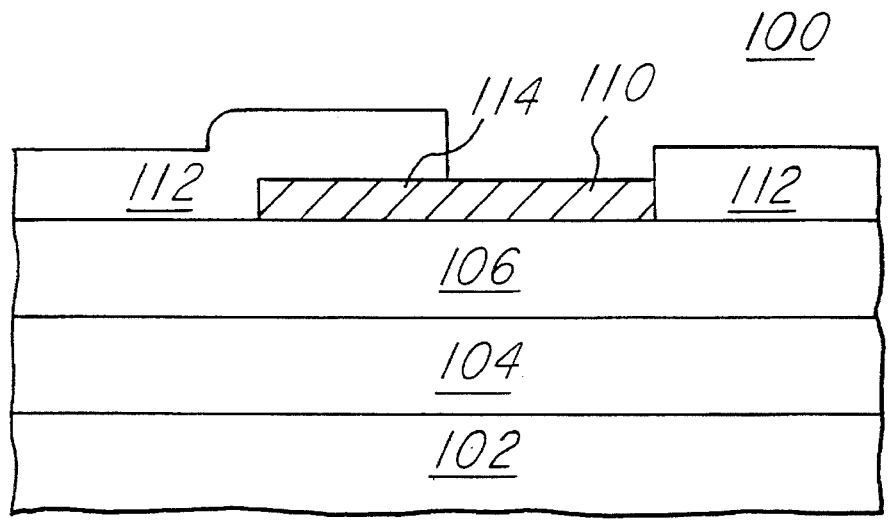
Figure 4D:
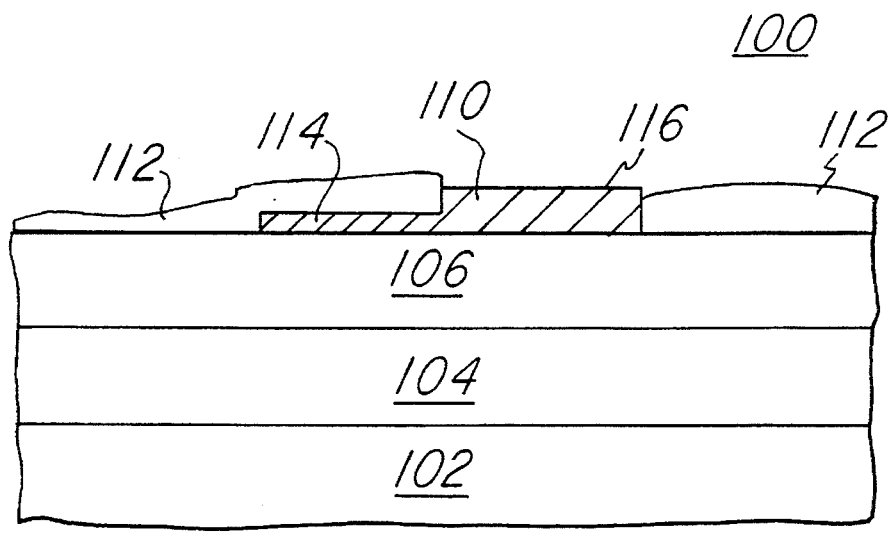

Referring to FIG. 4b, masking layer 108 is deposited on n-type epitaxial layer 106 and then patterned and etched to expose a portion of n-type epitaxial layer 106 where insulator 110 is to be formed. The exposed surface of n-type epitaxial layer 106 is then thermally oxidized to form insulator layer 110. Other methods for forming insulator layer 110 will be apparent to those skilled in the art, such as an oxide deposition. Masking layer 108 is then removed. A second masking layer 112 is then deposited on the surface of n-type epitaxial layer 108 and insulator layer 110. Masking layer 112 is then patterned and etched to expose a portion of insulator layer 110, as shown in FIG. 4c. Thin portion 114 of insulator layer 110 is masked by masking layer 112. Thick portion 116 of insulator layer 110 is then formed by a second thermal oxidation step as shown in FIG. 4d. Again other methods of forming thick portion 116 will be apparent to those skilled in the art. Masking layer 112 is then removed.

Figure 4E:
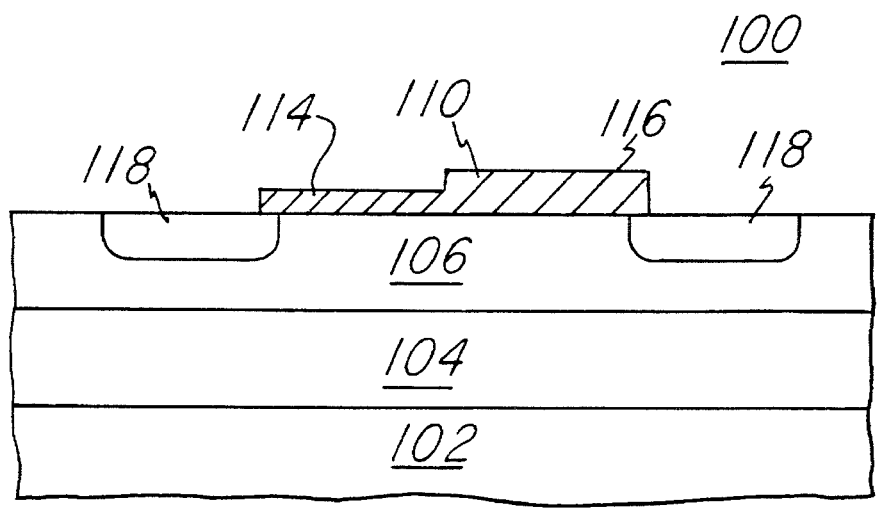
Figure 4F:
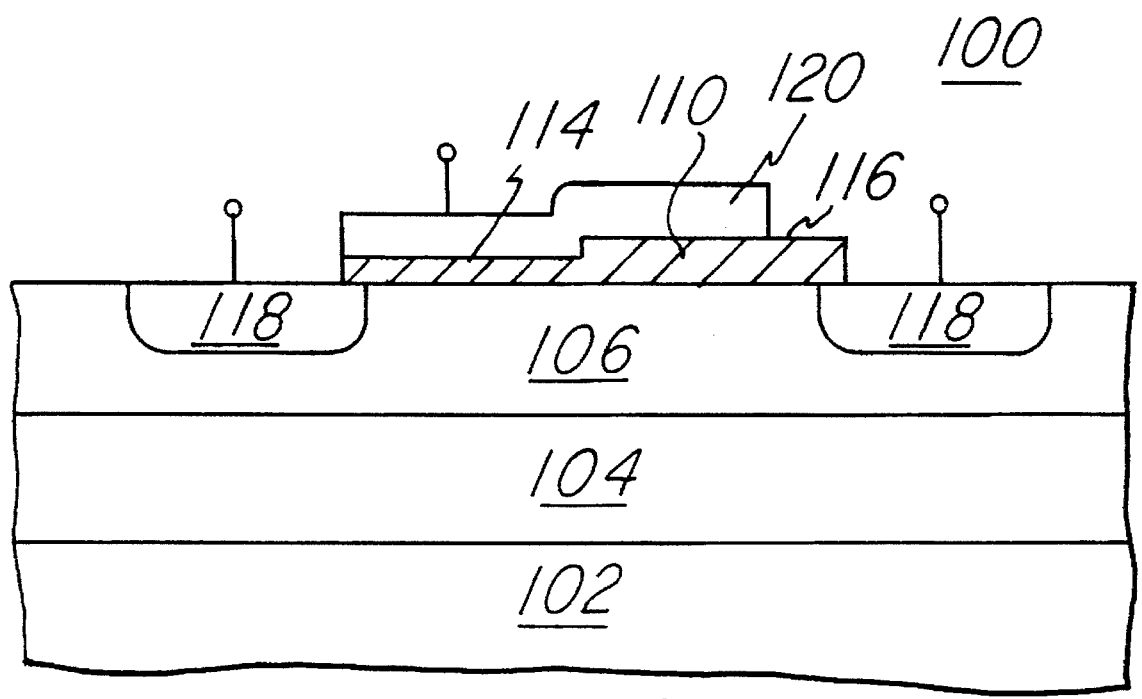

Referring to FIG. 4e, a n-type dopant, such as phosphorous is then implanted and annealed to form source/drain regions 118 in the surface of n-type epitaxial layer 25 106. Because source/drain regions 118 are n-type and formed in an n-type epitaxial layer 106, a high quality anneal is not need as there is no p-n junction involved. Source/drain regions 118 are self-aligned due to insulator layer 110. Finally, a conductive layer is deposited and etched to Form gate 120, as shown in FIG. 4f.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a MOSFET having a silicon carbide substrate of a first conductivity type, comprising the steps of:

epitaxially growing a layer of second conductivity type material on said silicon carbide substrate;

epitaxially growing a channel region of said first conductivity type above said layer of second conductivity type material;

thermally growing a first insulator layer over a portion of said channel region;

thermally growing a second insulator layer over a portion of said first insulator layer; implanting first and second source/drain regions with a dopant of said first conductivity type directly in said channel region; and forming a conductive layer over said first and second insulator layers.

2. The method of claim 1, wherein said first conductivity type is n-type.

3. The method of claim 1, wherein said first conductivity type is n-type and said second conductivity type is p-type.

4. The method of claim 1 wherein said step of forming said conductive layer comprises depositing a layer of material selected from the group of polysilicon, monocrystalline, microcrystalline, and polycrystalline silicon carbide.

\* \* \* \* \*